United States Patent [19]

Vial et al.

[11] 4,240,453
[45] Dec. 23, 1980

[54] APPARATUS FOR THE TREATMENT OF SURFACES INVOLVING THE USE OF AT LEAST A SOLVENT

[75] Inventors: Jean Vial, Eaubonne; Gérard Sauvan, Franconville, both of France

[73] Assignee: Societe d'Applications Generales d'Electricite et de Mecanique SAGEM, Paris, France

[21] Appl. No.: 14,026

[22] Filed: Feb. 22, 1979

[30] Foreign Application Priority Data

Feb. 28, 1978 [FR] France .................. 78 05701

[51] Int. Cl.³ .............................. B08B 3/02
[52] U.S. Cl. ................... 134/107; 134/109; 34/77
[58] Field of Search .......... 134/72, 104–105, 134/107–109; 34/77

[56] References Cited

U.S. PATENT DOCUMENTS

| | | | |
|---|---|---|---|
| 1,624,026 | 4/1927 | Utz | 134/105 UX |
| 2,460,150 | 1/1949 | Schupp | 34/77 X |
| 2,926,674 | 3/1960 | Umbricht et al. | 134/72 |
| 3,109,439 | 11/1963 | Evans et al. | 134/109 X |
| 3,144,872 | 8/1964 | Kearney | 134/104 X |

Primary Examiner—Robert L. Bleutge
Attorney, Agent, or Firm—Kirkland & Ellis

[57] ABSTRACT

An apparatus for the treatment of at least one surface of an article contained therein is disclosed. The treatment apparatus comprises a treatment enclosure which includes at least one inlet lock-chamber and at least one outlet lock-chamber with an article transport device extending therebetween. The treatment enclosure includes a solvent dispenser which is positioned with an outlet thereof adjacent the article transport device. Included within the apparatus is a vapor extractor for extracting air-solvent vapors from the treatment enclosure. The vapors extracted from the treatment enclosure are directed through a condenser positioned between the inlet lock-chamber and the outlet lock-chamber. Recycling ducts, communicating with the treatment enclosure and the vapor extractor, are also provided for recycling air, from which the solvent vapors have been substantially removed, toward the inlet of the inlet lock-chamber and the outlet of the outlet lock-chamber.

7 Claims, 2 Drawing Figures

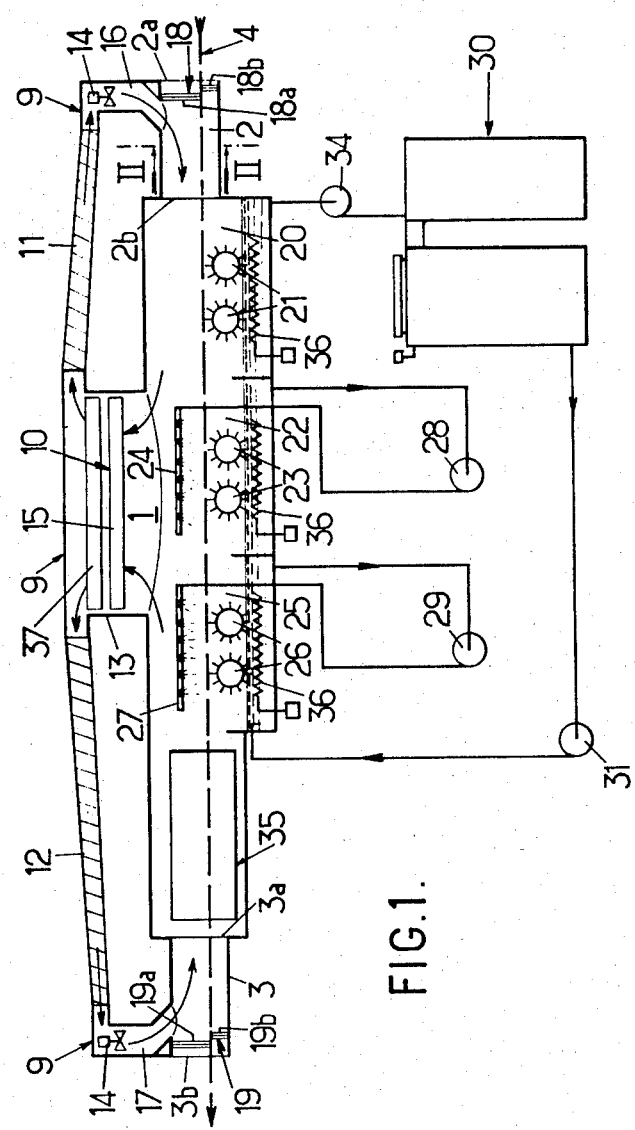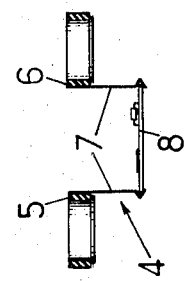

APPARATUS FOR THE TREATMENT OF SURFACES INVOLVING THE USE OF AT LEAST A SOLVENT

The invention relates to apparatus for the treatment of surface involving the use of at least a solvent, such apparatus comprising at least one treatment enclosure, at least one inlet lock-chamber and at least one outlet lock-chamber, said inlet and outlet lock-chambers allowing the objects having surfaces to be treated to be fed continuously.

The invention applies more particularly to apparatus for cleaning surfaces, particularly for cleaning the surfaces of printed circuits.

In apparatus for the treatment of surfaces involving the use of at least a solvent, there is posed a sealing problem at the inlet and outlet lock-chambers; in fact, solvent vapours must be prevented from leaving the treatment enclosure, while still allowing the objects to be fed freely in the inlet lock-chamber and the outlet lock-chamber.

It has then been proposed to equip these apparatus with sloping inlet and outlet lock-chambers directed upwardly in relation to the treatment enclosure, each lock-chamber being fitted with a condenser adapted to condense the solvent vapours which were sent back in liquid form into the treatment enclosure.

However, to obtain satisfactory sealing, it was necessary to make each lock-chamber very large and especially to give it a slope in relation to the vertical close to 45° (of the order of 40°); for a given length of the treatment enclosure, a length corresponding to the treatment envisaged, the apparatus, with its two upwardly inclined lock-chambers, presented a total length much greater than the length of the treatment enclosure, and also a height much greater than that of the treatment enclosure properly speaking.

Moreover, the feeding of the objects into apparatus of this kind took place over a complex path comprising first of all a descending part (inlet lock-chamber), then a horizontal part (treatment enclosure), then, finally, a rising part (outlet lock-chamber); it was then necessary to use complex and costly feeding means (conveyors).

Furthermore, it has already been proposed to equip the apparatus with extraction means for extracting the air-solvent vapour mixture from the treatment enclosure, and condensation means disposed so that this air-solvent vapour mixture can pass therethrough so as to condense the solvent vapours and send them back into the treatment enclosure.

However, even with these extraction means and these condensation means, losses of solvent were noted and outside pollution by the solvent vapours.

One solution has been proposed in an apparatus comprising an inlet lock-chamber and an outlet lock-chamber. This apparatus, described in U.S. Pat. No. 3,144,872, consists in equipping each inlet or outlet lock-chamber with a recirculating device. In the inlet lock-chamber, this recirculating device sucks in at the inlet of the lock-chamber and the air is directed towards the outlet of the lock-chamber. In the outlet lock-chamber, this recirculating device sucks in at the outlet of the lock-chamber and the air is directed towards the inlet of the lock-chamber.

This solution presents the same disadvantages as those enumerated above, i.e. loss of solvent and outside pollution by solvent vapours.

An aim of the invention is precisely to remedy the disadvantages which have just been discussed.

The invention has as an aim an apparatus, for the treatment of surfaces involving the use of a solvent, which is less cumbersome, not only in length but also in height.

Another aim of the invention is an apparatus, for the treatment of surfaces involving the use of a solvent, which presents a simple feed path for the objects and which, for this reason, allows simple and inexpensive feed means to be used.

A further aim of the invention is an apparatus, for the treatment of surfaces involving the use of a solvent, which, on the one hand, economizes on the solvent and, on the other hand, reduces the pollution of the air by vapours from this solvent in the neighbourhood of the apparatus.

The apparatus in accordance with the invention comprises a treatment enclosure, at least an inlet lock-chamber, at least an outlet lock-chamber, extraction means for extracting the air-solvent vapour mixture from the treatment enclosure, and condensation means disposed so that this air-solvent vapour mixture may pass therethrough in order to condense the solvent vapours and send them back into the treatment enclosure.

This apparatus is chararacterized by the fact that these extraction means and these condensation means cooperate with recycling ducts for directing the extracted and purified air, on the one hand, towards the inlet of the inlet lock-chamber and, on the other hand, towards the outlet of the outlet lock-chamber.

Preferably, this apparatus comprises furthermore reheating means disposed between the condensation means and the inlet and outlet lock-chambers.

The recycling of the air, at the inlet of the inlet lock-chamber and at the oulet of the outlet lock-chamber (i.e. in accordance with a solution opposed to that described in the above mentioned U.S. Patent) allows the apparatus to operate closed and any risk of pollution of the environment by solvent vapours to be avoided.

The sealing at the inlet lock-chamber and the outlet lock-chamber is provided by the circulation of the recycled air which passes through each lock-chamber in the direction going from the environment towards the treatment enclosure; it is then possible to construct these lock-chambers with very reduced length.

With the reheating means, there is introduced into the inlet and outlet lock-chambers reheated air from which solvent vapours have been at least partially removed; this air may then absorb the solvent vapours which are present in the inlet and outlet lock-chambers, and so any risk of the solvent vapours spreading outside the apparatus is avoided.

From the constructional point of view, the inlet and outlet lock-chambers may be disposed horizontally facing one another; the feed path of the objects is then particularly simple since it is a rectilinear path.

The invention consists, apart from the arrangements which have just been discussed, of certain other arrangements which are preferably used at the same time and which will be more explicitly discussed hereafter.

The invention will, in any case, be well understood with the help of the complement of description which follows, as well as with the accompanying drawings, which complement and drawings relate to a preferred embodiment of the invention and comprise, of course, no limiting character.

FIG. 1 of these drawings shows in longitudinal schematic section an apparatus in accordance with the invention.

FIG. 2 is a simplified section along II—II of FIG. 1.

According to the mode of application and the embodiment of the invention described above, it is proposed to provide an apparatus for cleaning surfaces, particularly for cleaning the surfaces of printed circuits.

The apparatus uses a solvent or a mixture of several solvents which will be more explicitly discussed hereafter.

The apparatus comprises, as shown in FIG. 1, at least one treatment enclosure 1, at least one inlet lock-chamber 2 and at least one outlet lock-chamber 3, disposed opposite one another.

These inlet 2 and outlet 3 lock-chambers allow the feeding of printed circuits: with reference to the feeding direction, the inlet lock-chamber 2 comprises an inlet 2a and an outlet 2b, and the outlet lock-chamber 3 comprises an inlet 3a and an outlet 3b.

This feeding may be provided by a rectilinear conveyor device 4 shown in FIG. 2 and which comprises two endless belt means 5 and 6 (bands, straps, chains) disposed in the same plane and equipped with a series of clips 7 which grip each printed circuit 8 presented between the two endless belt means 5 and 6.

This apparatus comprises furthermore, extraction means 9 for extracting the air-solvent vapour mixture from the treatment enclosure 1, condensation means 10 disposed so that this air-solvent vapour mixture may pass therethrough in order to condense the solvent vapours and send them back into the treatment enclosure 1, and recycling ducts 11 and 12 for directing the air extracted by the extraction means 9, on the one hand, towards the inlet 2a of the inlet lock-chamber 2 and, on the other hand, towards the outlet 3b of the outlet lock-chamber 3.

Advantageously, the apparatus is completed by reheating means 37 disposed between condensation means 10 and the inlet 2 and the outlet 3 lock-chambers.

The extraction means 9 may be formed by a chimney 13 disposed above the treatment enclosure 1 and by fans 14 which are advantageously disposed between the recycling ducts 11 and 12 and the inlet 2 and the outlet 3 lock-chambers.

The condensation means 10 are then formed by an exchanger 15, through which passes a cold fluid, and advantageously disposed in chimney 13.

The reheating means 37 may be advantageously disposed in chimney 13, immediately downstream of condensation means 10.

It is in fact at this position that room is more readily available, which allows reheating means of the most appropriate type to be chosen (heat exchanger, electrical resistances, heat exchanger-electrical resistance combination, etc.).

A deflector device 16 is advantageously provided at the inlet 2a of the inlet lock-chamber 2 in order to direct the air in this lock-chamber in the direction from the inlet 2a towards the outlet 2b.

Similarly, a deflector device 17 is advantageously provided at the outlet 3b of the outlet lock-chamber 3 in order to direct the air in this lock-chamber in the direction from the outlet 3b towards the inlet 3a.

At the inlet 2a of the inlet lock-chamber 2 and in front of the deflector device 16 (in relation to the feeding direction of the printed circuits), it is advantageous to provide a flexible door 18, for example of the type formed by two brushes 18a and 18b, with long bristles, staggered so that the ends of the bristles overlap.

Similarly, at the outlet 3b of the outlet lock-chamber 3 and behind the deflector device 17 (in relation to the feeding direction of the printed circuits), it is advantageous to provide a flexible door 19, for example of the type formed by two brushes 19a and 19b, with long bristles, staggered so that the ends of the bristles overlap.

Insofar as the treatment enclosure 1 is concerned, it may comprise several sections, for example three sections, that is the three successive sections disposed in the feeding direction of the printed circuits, a precleaning section 20 in which the printed circuits are subjected to the action of rotary brushes 21 acting on their surface where the soldered portions are to be found, a cleaning section 22 in which the printed circuits are subjected to the action of rotary brushes 23 acting on their surface where the soldered portions are to be found and to the action of a spraying device 24 acting by spraying with cylindrical jets on their surface where the components are to be found, and a rinsing section 25 in which the printed circuits are subjected to the action of rotary brushes 26 acting on their surface where the soldered portions are to be found and to the action of a spraying device 27 acting by spraying cylindrical jets on their surface where the components are to be found.

The spraying device 24 is fed by a pump 28 drawing the solvent from the cleaning section 22, and the spraying device 27 is fed by a pump 19 drawing the solvent from the rinsing section 25.

This treatment enclosure 1 is supplied with clean solvent from the rinsing section 25, which allows the rinsing of the printed circuits to be effected with the cleanest possible solvent.

The solvent then passes into the cleaning section 22, then into the precleaning section 20.

From this precleaning section 20, the solvent is directed, by first circulating means 34, towards regeneration means 30 of the distillation type, and, from these regeneration means 30, and through second circulating means 31, towards rinsing section 25.

The apparatus may furthermore comprise, between the rinsing section 25 and the outlet lock-chamber 3, a drying device 35. The efficiency of this drying device 35 is improved by the temperature of the recycled air which has passed through the reheating means.

Each section 20, 22 and 25 of the treatment enclosure 1 may comprise electrical heating resistances 36 so as to make it possible to operate with a warm solvent, brought to a temperature greater than the ambient temperature.

As far as the solvent is concerned, an azeotropic solvent of the fluorated alcohol type may be used.

Finally and whatever the emodiment, an apparatus is provided which presents, among others, the following advantages:

a smaller size, not only in length but also in height, a simple feed path (rectilinear path), simple and inexpensive means for feeding the objects (rectilinear conveyor), good sealing provided with short lock-chambers, risk of polluting the environment by solvent vapours practically eliminated, degree of humidity of the air-solvent vapour mixture practically constant since operation is in a closed cycle, enrichment of the solvent with water avoided.

As is evident, and as it follows moreover already from what has gone before, the invention is in no wise limited to those of its modes of application and embodiments which have been more particularly considered; it embraces, on the contrary, all variations thereof.

We claim:

1. An apparatus for cleaning, by the action of at least one solvent, at least one surface of an article contained therein, comprising:
    a. a treatment enclosure including at least one inlet lock-chamber and at least one outlet lock-chamber with an article transport means extending therebetween;
    b. at least one solvent dispensing means an outlet end of which being disposed in said treatment enclosure and adjacent article transport means;
    c. extraction means communicating with said treatment enclosure for extracting air-solvent vapors therefrom;
    d. condensation means cooperating with said extraction means and positioned between said inlet lock-chamber and said outlet lock-chamber and disposed so that air-solvent vapors extracted from said treatment enclosure pass therethrough for condensing the solvent vapors and recycling the solvent vapors to said treatment enclosure; and
    e. recycling duct means communicating with said treatment enclosure and said extraction means for recycling air that has had the solvent vapors substantially removed therefrom towards the inlet of said inlet lock-chamber and the outlet of said outlet lock-chamber.

2. The apparatus of claim 1, further including reheating means disposed between said condensation means and said recycling duct means.

3. The apparatus of claim 1, wherein said inlet lock-chamber and said outlet lock-chamber are disposed in a horizontal, spaced-apart relation.

4. The apparatus of claim 1, further including a drying means disposed within said treatment enclosure at a location between said outlet lock-chamber and said at least one solvent dispensing means.

5. The apparatus of claims 1, 2, 3, or 4, wherein said extraction means comprises at least one fan positioned to circulate air and solvent vapors existing within said treatment enclosure across said condensation means.

6. The apparatus of claims 1, 2, 3, or 4, wherein said extraction means comprises a channel communicating with said treatment enclosure and said recycling duct means and including a plurality of fans positioned between said condensation means and said inlet lock-chamber and said outlet lock-chamber.

7. The apparatus of claim 6, wherein said condensation means and said reheating means are located within said channel.

* * * * *